US006831861B2

(12) United States Patent
Fricke et al.

(10) Patent No.: US 6,831,861 B2
(45) Date of Patent: Dec. 14, 2004

(54) METHODS AND MEMORY STRUCTURES USING TUNNEL-JUNCTION DEVICE AS CONTROL ELEMENT

(75) Inventors: Peter Fricke, Corvallis, OR (US); Andrew L. Van Brocklin, Corvallis, OR (US); James E. Ellenson, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/756,450

(22) Filed: Jan. 12, 2004

(65) Prior Publication Data

US 2004/0141351 A1 Jul. 22, 2004

Related U.S. Application Data

(60) Division of application No. 10/236,274, filed on Sep. 6, 2002, now Pat. No. 6,711,045, which is a continuation-in-part of application No. 10/116,497, filed on Apr. 2, 2002.

(51) Int. Cl.[7] .................................................. G11C 7/00
(52) U.S. Cl. ............................. 365/185.18; 365/185.2; 365/185.24; 365/51; 365/63; 365/96
(58) Field of Search ........................ 365/185.18, 185.2, 365/185.24, 51, 63, 96

(56) References Cited

U.S. PATENT DOCUMENTS

| 3,271,591 A | 9/1966 | Ovshinsky |
| 3,530,441 A | 9/1970 | Ovshinsky |
| 3,641,516 A | 2/1972 | Castrucci et al. |
| 4,499,557 A | 2/1985 | Holmberg et al. |
| 4,599,705 A | 7/1986 | Holmberg et al. |

(List continued on next page.)

OTHER PUBLICATIONS

Victor, W.C. Chan et al, "Multiple layers of CMOS Integrated Circuits Using REcrystallized SiliconFilm", IEEE Electron Device Letters, V. 22, No 2, Feb 2001, pp. 77–79.

Thomas H. Lee, "A Vertical Leap for Microchips", Scientific American, Jan 2002, pp 53–59.

(List continued on next page.)

*Primary Examiner*—Viet Q. Nguyen

(57) ABSTRACT

A memory structure includes a memory storage element electrically coupled to a control element. The control element comprises a tunnel-junction device. The memory storage element may also comprise a tunnel-junction device. Methods for fusing a tunnel-junction device of a memory storage element without fusing a tunnel-junction device of an associated control element are disclosed. The memory storage element may have an effective cross-sectional area that is greater than an effective cross-sectional area of the control element. A memory structure comprises a memory storage element, a control element comprising a tunnel-junction device electrically coupled to the memory storage element and configured to control the state of the memory storage element, and a reference element. The reference element is configured as a reference to protect the control element when selectively controlling the state of the memory storage element. The reference element may comprise a tunnel-junction device and be used with a current source to fuse a memory storage element without fusing a tunnel-junction device of an associated control element. Methods of making the memory structure and using it in electronic devices are disclosed.

25 Claims, 5 Drawing Sheets

U.S. PATENT DOCUMENTS

| | | | |
|---|---|---|---|
| 5,335,219 A | | 8/1994 | Ovshinsky et al. |
| 5,751,012 A | | 5/1998 | Wolstenholme et al. |
| 5,821,558 A | | 10/1998 | Han et al. |
| 6,034,882 A | | 3/2000 | Johnson et al. |
| 6,111,302 A | | 8/2000 | Zhang et al. |
| 6,185,122 B1 | | 2/2001 | Johnson et al. |
| 6,251,710 B1 | | 6/2001 | Radens et al. |
| 6,351,406 B1 | | 2/2002 | Johnson et al. |
| 6,372,633 B1 | | 4/2002 | Maydan et al. |
| 6,380,003 B1 | | 4/2002 | Jahnes et al. |
| 6,549,447 B1 | * | 4/2003 | Fricke et al. ............... 365/105 |
| 6,707,698 B2 | * | 3/2004 | Fricke et al. ............... 365/105 |
| 6,711,045 B2 | * | 3/2004 | Fricke et al. ................ 365/63 |
| 6,751,149 B2 | * | 6/2004 | Seyyedy et al. ......... 365/225.7 |
| 6,774,458 B2 | * | 8/2004 | Fricke et al. ............... 257/530 |
| 6,781,858 B2 | * | 8/2004 | Fricke et al. ................ 365/51 |
| 2001/0011776 A1 | | 8/2001 | Igarashi et al. |
| 2001/0036750 A1 | | 11/2001 | Radens et al. |
| 2001/0055838 A1 | | 12/2001 | Walker et al. |
| 2002/0058408 A1 | | 5/2002 | Maydan et al. |
| 2002/0075719 A1 | | 6/2002 | Johnson et al. |
| 2002/0083390 A1 | | 6/2002 | Lee et al. |
| 2003/0161175 A1 | * | 8/2003 | Fricke et al. ............... 365/105 |
| 2004/0017726 A1 | * | 1/2004 | Fricke et al ............. 365/225.7 |

OTHER PUBLICATIONS

Esmat Hamdy et al, "Dielectric based antifuses for logic and memory ICs" IEEE International Electron Devices Meeting, IEDM, 88, Aug. 1988, pp 786–789.

Chenming Hu, "Interconnect devices for field programmable gate array", IEEE International Electron Devices Meeting, IEDM 92, Apr. 1992, pp 591–594.

Jonathan Greene et al, "Antifuse Field Programmable Gate Arrays", Proc. IEEE vol. 81, No 7, Jul. 1993, pp 1042–1056.

Vivek, D. Kulkarni et al, "Patterning of Submicron Metal Features and Pillars in Multilevel Metallization" J. Electrochemical Soc., V.135 (12), Dec. 1988, pp 3094–3098.

* cited by examiner

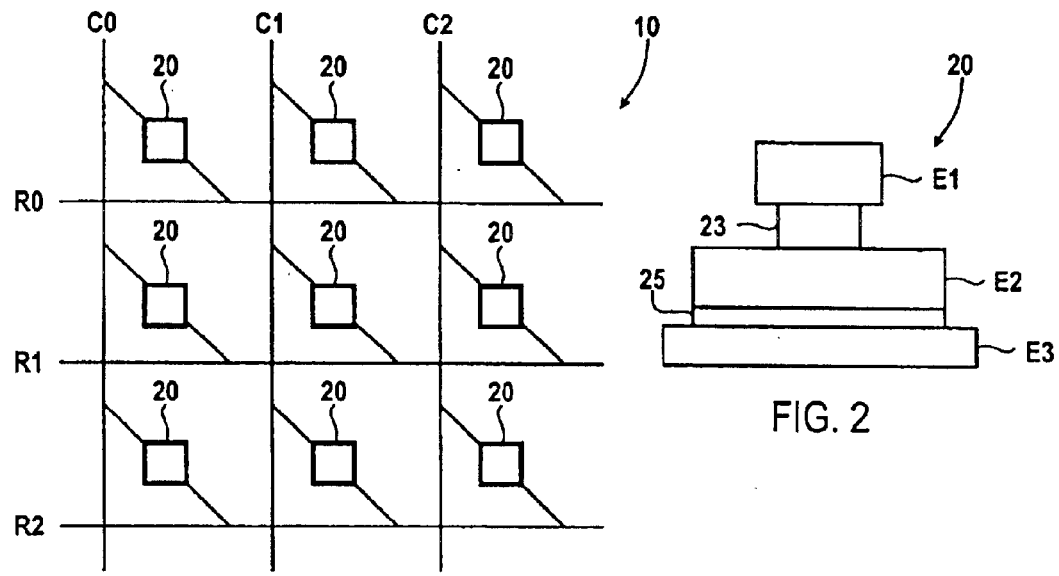
FIG. 1
FIG. 2
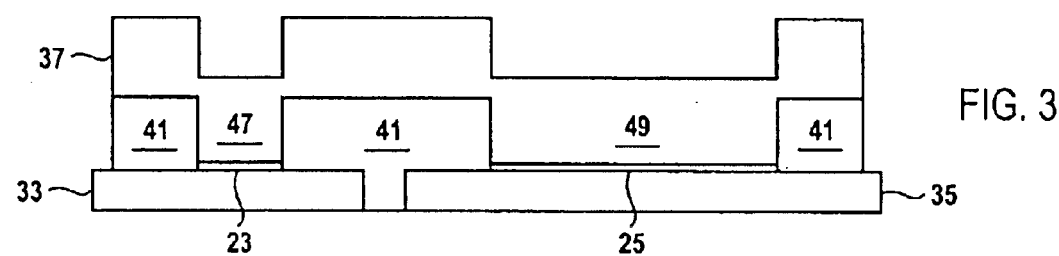
FIG. 3
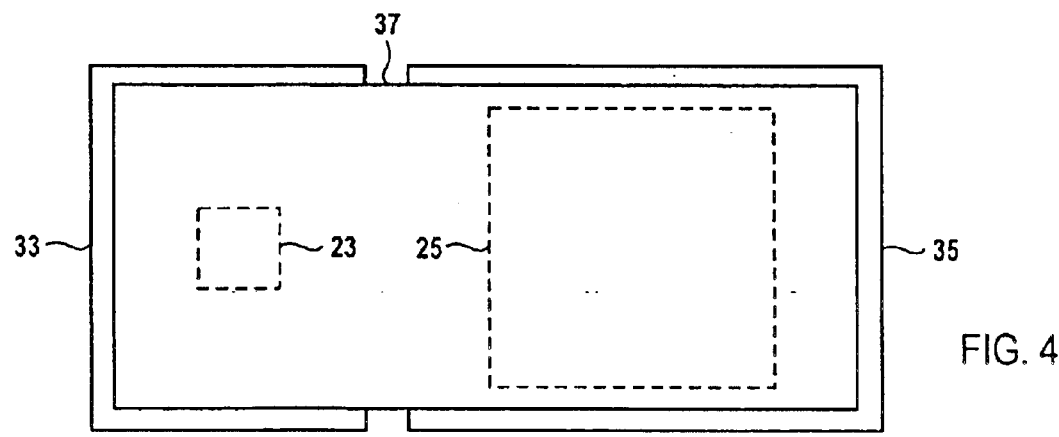
FIG. 4

METHODS AND MEMORY STRUCTURES USING TUNNEL-JUNCTION DEVICE AS CONTROL ELEMENT

CROSS-REFERENCE TO RELATED APPLICATION

This application is a divisional of commonly assigned application No. Ser. 10/236,274, filed Sep. 6, 2002 now U.S. Pat. No. 6,711,045 the entire disclosure of which is incorporated herein by reference and which is a continuation-in-part of co-pending and commonly assigned application Ser. No. 10/116,497, filed Apr. 2, 2002, the entire disclosure of which is incorporated herein by reference.

TECHNICAL FIELD

This invention relates to integrated circuits including memory structures and relates to methods for making such memory structures and to methods using such memory structures in electronic devices.

BACKGROUND

As computer and other electrical equipment prices continue to drop, the manufacturers of storage devices, such as memory devices and hard drives, are forced to lower the cost of their components. At the same time, markets for computers, video games, televisions and other electrical devices are requiring increasingly larger amounts of memory to store images, photographs, videos, movies, music, and other storage intensive data. Thus, besides reducing costs, manufacturers of storage devices must also increase the storage density of their devices. This trend of increasing memory storage-density while reducing costs required to create the storage has been on-going for many years, and even optical storage media, such as CD-ROM, CD-R, CD-RIW, DVD, and DVD-R variants, are being challenged by device size limitations and costs. There is accordingly a need for economical, high capacity memory structures and methods for control of such memory structures. While resistive elements, transistors, and diodes have been used as control elements in the past, they have had various shortcomings in speed, silicon area requirements, and in allowing "sneak paths."

BRIEF DESCRIPTION OF THE DRAWINGS

The features and advantages of the disclosure will readily be appreciated by persons skilled in the art from the following detailed description when read in conjunction with the drawings, wherein:

FIG. 1 is a schematic diagram of an embodiment of a cross-point memory array in which the disclosed memory cell structures can be utilized.

FIG. 2 is a schematic block diagram of an embodiment of a memory cell that includes a memory storage element and a control element for the memory storage element.

FIG. 3 is a side-elevation cross-sectional view showing schematically an embodiment of a memory structure that includes a memory storage element and a control element made in accordance with the invention.

FIG. 4 is a top plan view of the embodiment of FIG. 3

DETAILED DESCRIPTION OF EMBODIMENTS

Figure 5:
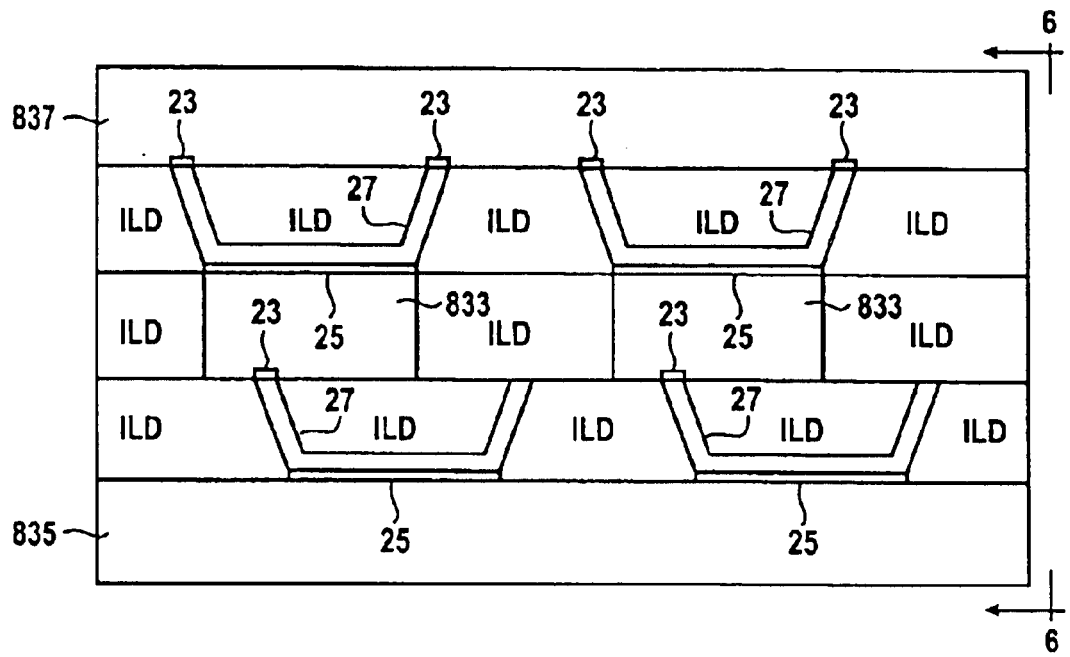
FIG. 5 is a cross-sectional view that schematically depicts another embodiment of a memory structure made in accordance with the invention.

Throughout this specification and the appended claims, the term "horizontal" means generally parallel to a substrate or generally parallel to the layers of a multi-layer structure, and the term "vertical" means generally perpendicular to a substrate or generally perpendicular to the layers of a multi-layer structure.

In accordance with the present invention, a method of using a tunnel-junction device as a control element for a memory that has memory storage elements that include an antifuse tunnel-junction device is disclosed. This method includes selectively fusing the tunnel-junction device of a memory storage element that includes such an antifuse device. In a first embodiment of this method, a control element including a second tunnel-junction device is connected in series with the memory storage element, thereby forming a series combination. While the second tunnel-junction device of the control element is protected from fusing, a suitable current is applied to the series combination to fuse the first tunnel-junction device of the memory storage element. Other aspects of the invention include various memory structures specially adapted for the use of tunnel-junction devices as control elements. Various memory structure embodiments are specially adapted for use with the particular methods described below for using tunnel-junction devices as control elements. These memory structures are also described in detail below. Such methods and specially-adapted memory structures are used in memories for integrated circuits, storage devices, and other electronic devices.

FIG. 1 is a simplified schematic diagram of an embodiment of a cross-point memory array 10 in which the disclosed memory cell structures can be utilized. Memory arrangement 10 includes row selection conductor lines R0, R1, R2 and column selection conductor lines C0, C1, C2. A memory cell 20 is connected between each row selection conductor line R0, R1, or R2 and each column selection conductor line C0, C1, or C2. It should be appreciated that the row selection conductor lines and the column selection conductor lines are referred to by "row" and "column" terminology for convenience, and that in actual implementations the memory cells 20 do not necessarily have to be physically arranged in rows and columns. Each memory cell is uniquely accessed or selected by a first selection line and a second selection line, each of which can be oriented in various ways. Also, the column lines do not have to be orthogonal to the row lines, but are illustrated in that manner for ease of understanding.

FIG. 2 is a simplified electrical block diagram of an embodiment of memory cell 20 which includes a memory storage element 23 that is electrically connected to a control element 25 by an electrode E2. Memory storage element 23 and control element 25 are serially connected between an electrode E1 and an electrode E3. Electrodes E1–E3 comprise conductive elements such as conductors, conductive regions, or other conductive features, and it should be appreciated that electrode E2 can comprise one or more electrically conductive elements.

Memory storage element 23 is configured as a change-of-state memory storage element, while control element 25 is configured as a control element for the change-of-state memory storage element and provides current to memory storage element 23. More particularly, memory storage element 23 is configured to predictably and reliably break down at a lower energy level than the control element, while the tunnel-junction region of control element 25 is configured for sustained operation as a control element for the memory.

Memory storage element 23 includes an effective cross-sectional area through which current flows, and, similarly, control element 25 includes its own effective cross-sectional area through which current flows. For example, such an effective cross-sectional area can be defined by the overlap of the interfaces between the element and the electrodes on either side of the element. In the memory structures disclosed herein, control element 25 and memory element 23 can be of the same device type, and control element 25 can have a cross-sectional area that is about equal to or greater than the cross-sectional area of memory storage element 23. For example, the respective effective cross-sectional areas may be made such that the memory storage element will break down at a lower energy level than the control element. In other words, the ratio between the control element cross-sectional area and the memory storage element cross-sectional area can be selected so that the memory storage element functions as a state-change memory storage element, while the control element has control element cross-sectional area configured for sustained operation as a control element for the memory storage element. Thus, in accordance with this method, memory storage element 23 changes state at a lower energy level than the control element 25, which allows the memory storage element to be programmed. In this manner, a memory cell is programmed by selectively providing sufficient energy to the cell to cause the memory storage element to break down. A memory cell is read by providing a lesser amount of energy to the cell and sensing whether current flows through the cell. By way of illustrative example, in this method, the ratio between the cross-sectional area of the control element and the cross-sectional area of the memory storage element can be in the range of about 2 to 20.

Other methods of ensuring that control element 25 sustains operation as a control element for memory storage element 23 are described hereinbelow. In some of those methods, control element 25 can have a cross-sectional area that is about equal to the cross-sectional area of memory storage element 23.

Memory storage element 23 can be an antifuse device, such as a programmable tunnel-junction device. The antifuse device can be either a dielectric rupture type device or a tunnel-junction device. The tunnel junction can be formed from oxidized metal, thermally grown oxide, or deposited oxides or nitrides. Memory storage element 23 may also be embodied with various device types and including various semiconductor materials, such as polysilicon or polycrystalline silicon, amorphous silicon, microcrystalline silicon, metal filament electro-migration, trap induced hysteresis, ferroelectric capacitor, Hall effect, or polysilicon resistors. Other embodiments of memory storage element 23 include tunneling magneto-resistive or capacitive elements as floating gates. Still further, memory storage element 23 can be a read-only LeComber or silicide switch or a re-writable phase-change material including a write-erase-write phase-change material. Memory storage element 23 can also comprise a PIN diode or a Schottky diode.

In general, control element 25 can comprise a tunnel-junction device or PN, PIN, or Schottky diodes. Other diodes that can be used include Zener diodes, avalanche diodes, tunnel diodes, and a four layer diode device such as a silicon controlled rectifier. Also, control element 25 can be a junction field-effect or bipolar transistor. Control element 25 is sized sufficiently to carry an adequate current such that the state of the storage element 23 can be changed. When the control element includes a diode, the diode can be formed using doped polysilicon, amorphous silicon, or microcrystalline silicon.

Memory storage element 23 and control element 25 can also be of the same device type, wherein both can comprise tunnel-junction devices, Schottky diodes, or PIN diodes, for example.

For conciseness, the disclosed memory structures are described as employing tunnel-junction devices in both the memory storage elements and control elements, and it should be appreciated that the memory storage elements and control elements can be implemented as described previously.

By way of illustrative examples, the disclosed memory structures will be shown as integrated circuits that include an interlayer dielectric (ILD) that provides support and isolation between various structures of an integrated circuit. Such an interlayer dielectric may be composed of insulating materials such as silicon dioxide, silicon nitride, or TEOS (tetraethylorthosilicate), for example. The interlayer dielectric can be deposited using several different technologies such as chemical vapor deposition (CVD), atmospheric pressure CVD, low pressure CVD, plasma enhanced CVD, physical vapor deposition (PVD), and sputtering. For convenience, regions and layers of such dielectric are identified in the drawings by the reference designation ILD.

FIGS. 3 and 4 schematically depict an embodiment of a memory cell that includes a memory storage element 23 disposed on a first conductor 33. A control element 25 is disposed on a second conductor 35 that is laterally or transversely adjacent to first conductor 33. Memory storage element 23 and control element 25 are thus horizontally, transversely, or laterally separated and each can have a generally horizontal planar extent. First and second conductors 33 and 35 can be substantially coplanar, and memory storage element 23 and control element 25 can also be substantially co-planar. A dielectric layer 41 is disposed over the first and second conductors 33 and 35 and includes openings 47 and 49 over memory storage element 23 and control element 25. A conductive layer 37 is disposed on dielectric layer 41 and extends into openings 47 and 49 so as to form an electrode between memory storage element 23 and control element 25.

Memory storage element 23 can be formed of an oxide of first conductor 33, while control element 25 can be formed of an oxide of the underlying second conductor 35. Alternatively, memory storage element 23 can be formed of an oxide that is different from an oxide of first conductor 33, and control element 25 can be formed of an oxide that is different from an oxide of second conductor 35. Memory storage element 23 can also be a portion of an un-patterned oxide layer that can be a deposited oxide layer or a completely oxidized deposited metal layer, for example. Similarly, control element 25 can be a portion of an un-patterned oxide layer that can be a deposited oxide layer or a completely oxidized deposited metal layer, for example.

Figure 6:
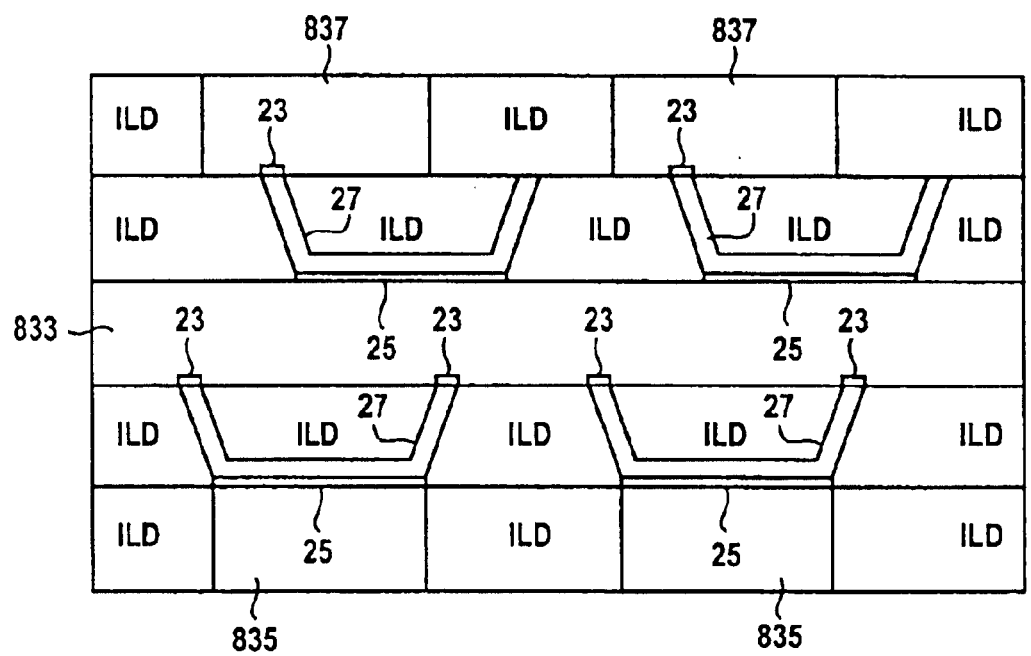
FIG. 6 is a cross-sectional view that schematically depicts another view of the memory-structure embodiment of FIG. 5.

FIGS. 5 and 6 schematically depict in cross-sectional views an embodiment of a memory structure that includes a plurality of memory cells each including a memory storage element 23 disposed between the rim edge of a conductive well or tub 27 and a conductor 833 or 837 that is vertically adjacent to the rim edge. Each memory cell further includes a control element 25 disposed between the base of conductive tub 27 and a conductor 833 or 835 that is vertically adjacent to the base. Memory storage element 23 and/or control element 25 can have a horizontally planar extent and can be horizontally or vertically separated.

The memory cells of FIGS. 5 and 6 can be implemented in stacked layers, for example, wherein a conductor 833 that is vertically adjacent to the rim edge of a given conductive tub 27 is vertically adjacent to the base of a conductive tub 27 that is in an adjacent layer.

By way of illustrative example, conductor 833 can be a row selection line while conductors 835 and 837 can be column selection lines in a cross-point memory structure. Also by way of illustrative example, a conductive tub 27 can be laterally offset relative to conductor 833 that is vertically adjacent to the rim of such a conductive tub 27. Such a lateral offset may be used to control the area of memory tunnel-junction oxide region 23, for example. As a result, a conductive tub 27 is laterally offset relative to another vertically adjacent conductive tub 27 in an adjacent layer.

Memory storage element 23 can formed of an oxide of the conductive tub 27, and control element 25 can be formed of an oxide of conductor 833 or 835 that is vertically adjacent to the base of conductive tub 27. Alternatively, memory tunnel-junction oxide region 23 can be formed of an oxide that is different from an oxide of the rim of the conductive tub 27, and control tunnel-junction oxide region 25 can be formed of an oxide that is different from an oxide of conductor 833 or 835. Memory storage element 23 can also be a portion of an un-patterned oxide layer that can be a deposited oxide layer or a completely oxidized deposited metal layer, for example. Similarly, control element 25 can be a portion of an un-patterned oxide layer that can be a deposited oxide layer or a completely oxidized deposited metal layer, for example.

Figure 7:
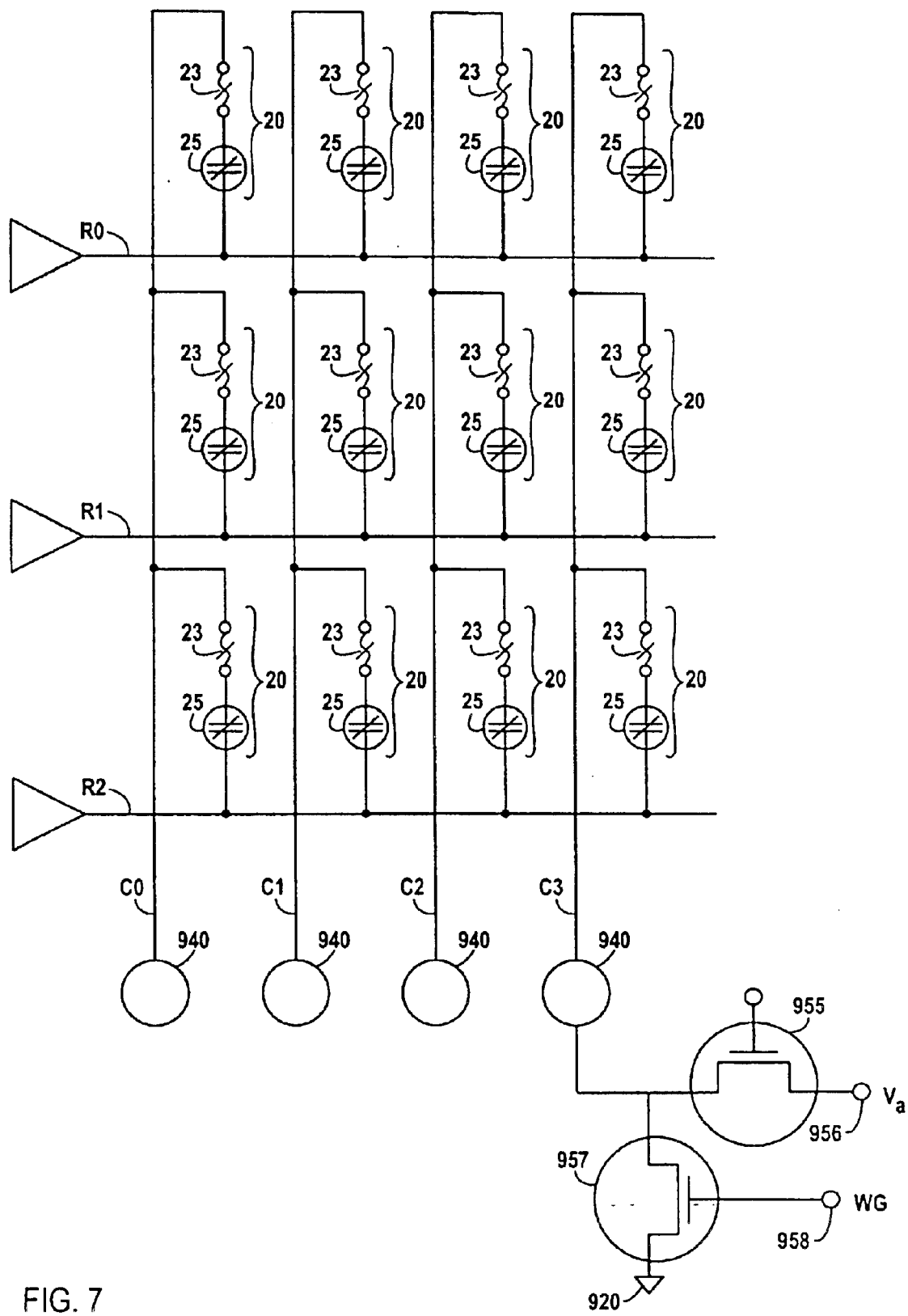
FIG. 7 is a schematic diagram illustrating use of a memory structure made in accordance with the invention.

By way of illustrative example, FIG. 7 is a schematic diagram illustrating use of a memory structure embodiment made in accordance with the invention in a memory. For clarity, different symbols are used for memory storage element 23 and control element 25 in FIGS. 7 and 9–11, although their physical construction can be similar or even identical in some embodiments of the invention. Circuit ground is identified by a conventional ground symbol with reference numeral 920 in FIGS. 7 and 9–11. As shown above in FIGS. 2–4, each memory cell 20 comprises a memory storage element 23 electrically coupled with a control element 25. The memory cells 20 may be selectively addressed using a row selection conductor line R0, R1, or R2 and a column selection conductor line C0, C1, C2, or C3. Sense amplifiers 940 are electrically coupled to the column selection lines C0, C1, C2, and C3 in FIG. 7. Similarly, sense amplifiers (not shown) may be electrically coupled to row selection conductor lines R0, R1, and R2. To simplify the drawing, column selection devices are shown only for column selection line C3, but it will be readily recognized that each column selection line may have such devices. An FET device 955 connects array nominal voltage $V_a$ from a supply pad 956 selectively to column line C3, for example, when gated by a FET device 957 controlled by a write gate signal WG applied from pad 958.

Figure 8:
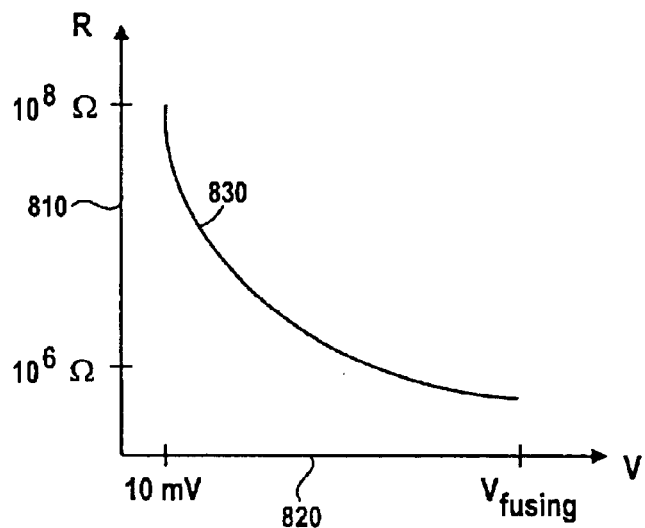
FIG. 8 is a graph showing resistance versus voltage for elements of a memory structure made in accordance with the invention.

FIG. 8 is a graph showing a nonlinear resistance versus voltage characteristic curve for a tunnel-junction device of a type that can be used either as a storage-element antifuse or as a control element of a memory cell structure made in accordance with the invention. In FIG. 8, vertical axis 810 is the tunnel-junction resistance, R, shown on a logarithmic scale. Horizontal axis 820 is the applied voltage $V_a$, also shown on a logarithmic scale. $V_{fusing}$, the characteristic threshold voltage at which the tunnel-junction device fuses (which can be about 2 V±about 1 V, for example), is indicated along the voltage axis. As shown by curve 830 in FIG. 8, the resistance R varies nonlinearly over a wide range when the applied voltage V is varied. The resistance varies upward nonlinearly, typically by one to two orders of magnitude, from about $10^5$–$10^6$ ohms at the fusing voltage, $V_{fusing}$, shown at the right side of FIG. 8, to as high as $10^8$ ohms with a low applied voltage, e.g., about 10 millivolts (mV) as shown at the left side of FIG. 8.

While the invention should not be construed as being limited to the consequences of any particular theory of operation, the phenomenon illustrated by FIG. 8 is believed to contribute to functionality and performance of some of the embodiments disclosed herein. In particular, the high resistance of a tunnel-junction device at low bias potentials reduces any parasitic "sneak path" contribution of memory cells that are not selected.

Figure 9:
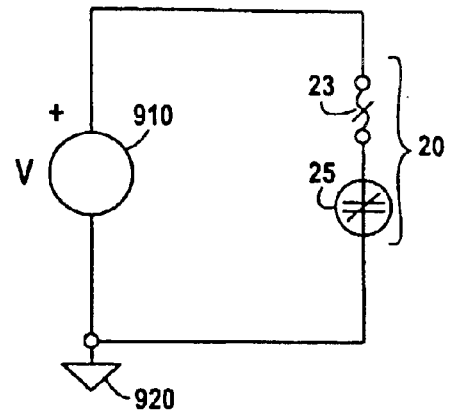
FIG. 9 is a circuit schematic illustrating use of a memory structure made in accordance with the invention.

FIG. 9 is a circuit schematic illustrating use of a memory structure made in accordance with the invention. Electrical energy is applied from a current source 910 to memory cell 20 comprising the series combination of a memory storage element 23 with a control element 25. It will be recognized that the individual voltages across memory storage element 23 and control element 25 will depend upon the common series current and the individual resistances of memory storage element 23 and control element 25. In order to use the tunnel-junction device of control element 25 as a steering element, it may be made with resistance that is low in comparison with the resistance of memory storage element 23. By way of illustrative example, the tunnel-junction device may be made with suitably low resistance by forming the tunnel-junction of control element 25 with a larger cross-sectional area than the cross-sectional area of memory storage element 23, as described hereinabove. A suitable cross-sectional area ratio is about 2:1 or more, e.g., up to about 20:1. Thus, the cross-sectional area of control element 25 may advantageously be made at least twice the cross-sectional area of memory storage element 23. Cross-sectional area ratios even higher than 20:1 may be used, but require increased areas for the tunnel-junction devices of control elements 25, thus providing lower device densities and incurring higher costs.

Figure 10:
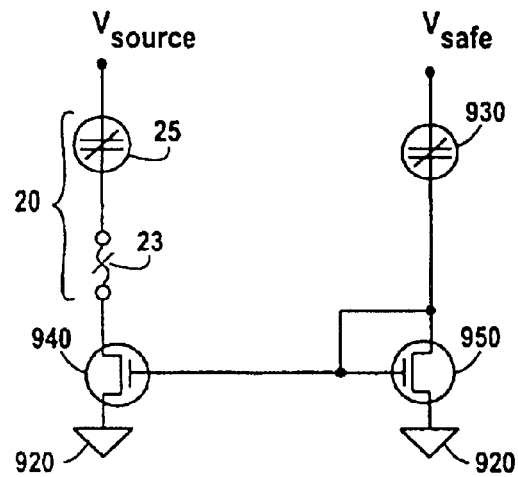
FIG. 10 is a circuit schematic illustrating an arrangement of elements in memory structures made in accordance with the invention.

FIG. 10 is a circuit schematic illustrating, in a simplified case, an alternative memory structure embodiment using a reference tunnel-junction device. Reference tunnel-junction device 930 is similar or even identical in construction and effective cross-sectional area to control element 25. Reference device 930 is connected in a current-mirror configuration with the series combination 20 of memory storage element 23 and control element 25. Fusing voltage for memory storage element 23 is applied to the series combination of memory storage element 23 and control element 25

(shown at the left side of FIG. 10) for a time interval. Sense amplifiers 940 and 950 operate to prevent a voltage greater than the fusing voltage for the control element from being present across control element 25 during or after that time interval. It should be noted that a sense amplifier such as sense amplifiers 940 and 950 can sense voltage or current or both and can sense them for one or more lines in a memory array.

Figure 11:
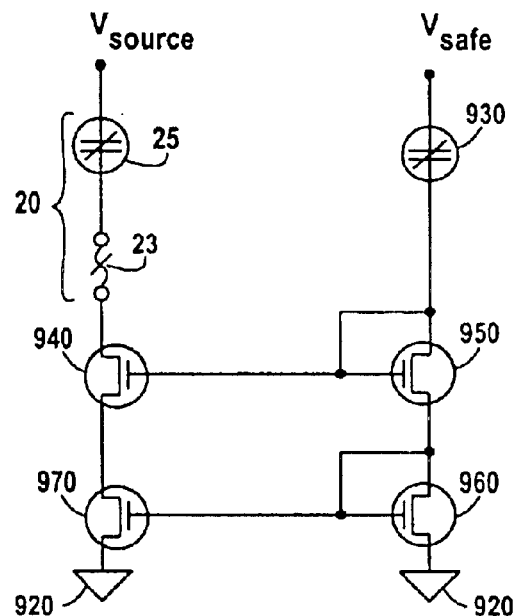
FIG. 11 is a circuit schematic illustrating an alternative arrangement of elements in memory structures made in accordance with the invention.

FIG. 11 is a circuit schematic illustrating an alternative arrangement of elements in memory structures made in accordance with the invention. The circuit illustrated in FIG. 11 has a current source consisting of devices 940, 950, 960, and 970. The particular type of current mirror source illustrated in FIG. 11 is commonly known as a cascode circuit. It will be recognized by those skilled in the art that other types of current sources may be used, such as Wilson current sources and "high-swing" cascode current sources.

Figure 12A:
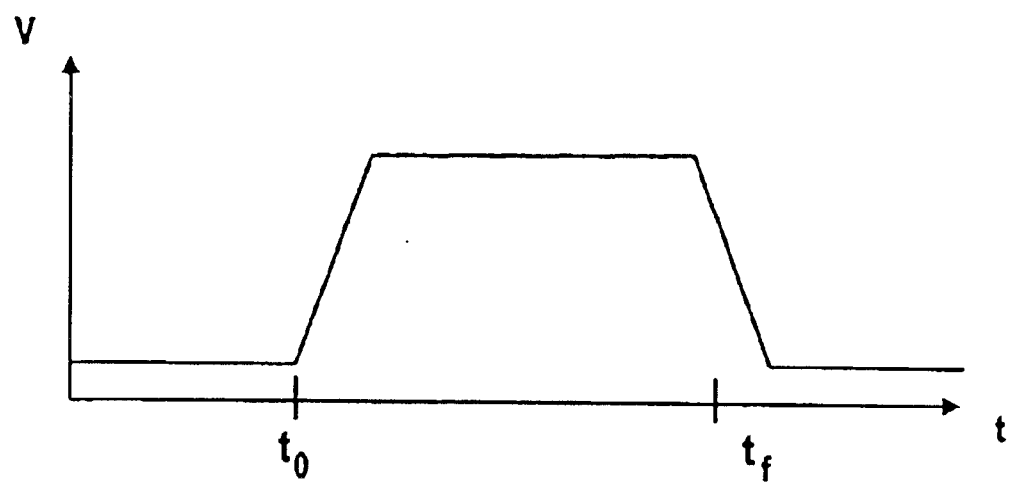
FIGS. 12A–12C are graphs illustrating voltage versus time profiles of tunnel-junction devices made in accordance with the invention.
Figure 12B:
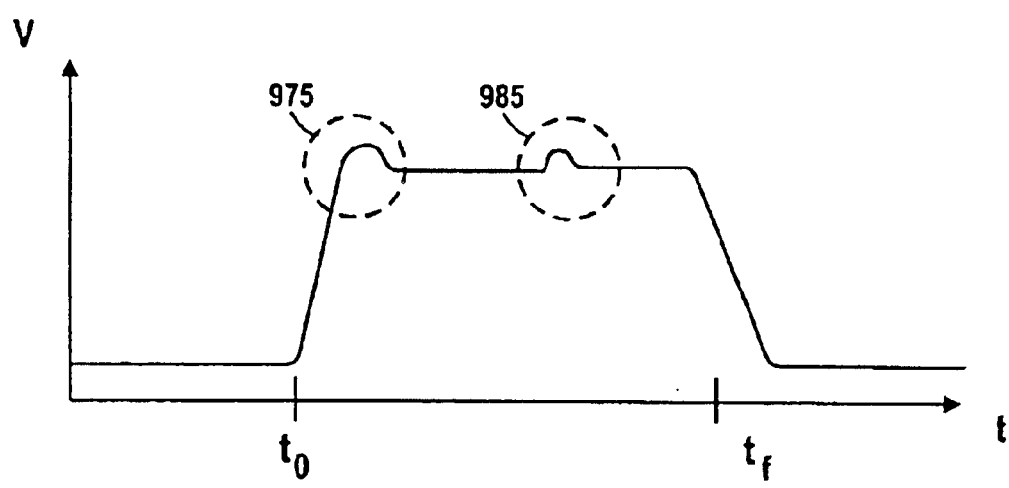
Figure 12C:
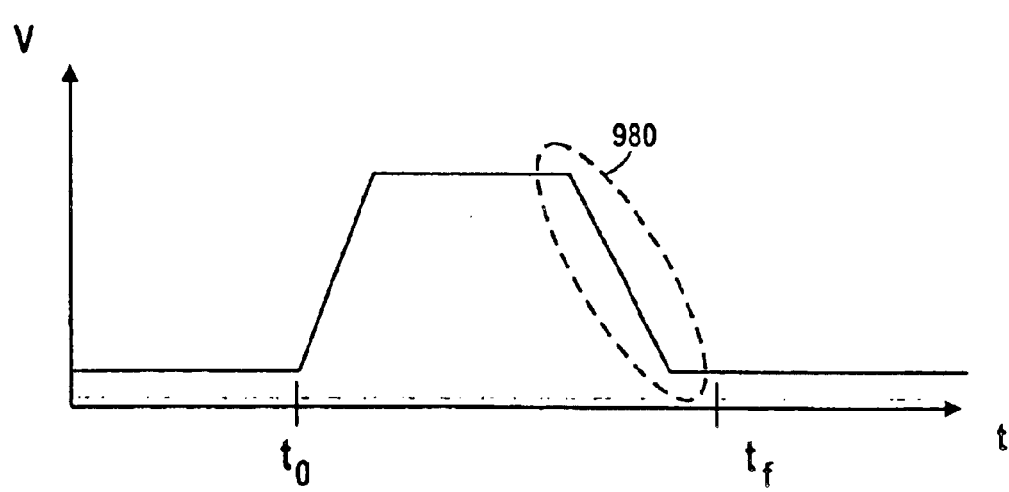

FIGS. 12A–12C are graphs illustrating the electrical profile (voltage versus time) of the memory cell and tunnel-junction devices made in accordance with the invention. FIG. 12A (top graph) shows the voltage across memory cell 20. FIG. 12B (middle graph) shows the voltage across control element 25. FIG. 12C (bottom graph) shows the voltage across memory storage element 23. A supply voltage $V_{safe}$ is provided to the current source. At time $t_0$, the appropriate row and column are selected to begin a write operation to memory cell 20, i.e., by applying write voltage across the memory cell. The first small bump indicated by reference numeral 975 on the voltage across control element 25 in FIG. 12B is overshoot that occurs for a time determined by the current source circuit response time. The falling edge indicated by reference numeral 980 on the voltage curve of memory storage element 23 is the fusing event, in which the antifuse is shorted. The second small bump indicated by reference numeral 985 on the voltage across control element 25 in FIG. 12B corresponds directly in time to the fusing event 980, and its magnitude and duration are proportional to the response time of the current source circuit. Finally, at time $t_f$, the write pulse voltage is terminated to end the write operation. The current source prevents a voltage greater than $V_{safe}-V_{source}$ from appearing across the control element 25 after a fusing event. Thus, utilizing a current-source reference circuit, the control element may be protected from fusing during a write operation that fuses the antifuse of the memory storage element, even if the control element and the memory storage element have identical effective cross-sectional areas and device type or construction.

Thus, a method is performed in accordance with the present invention in which the tunnel junction of a control element may be protected from fusing by coupling a sense amplifier to memory cell 20. At least one parameter is sensed: a suitable voltage and/or the current through the series combination of memory storage element 23 and control element 25. The current through the series combination is controlled to a suitable value in accordance with the parameter sensed. In this method embodiment, the suitable voltage sensed can be a voltage determined by electrically coupling a reference tunnel-junction device to a current source.

INDUSTRIAL APPLICABILITY

The methods of the invention and memory structures specially adapted for those methods are useful in single-layer cross-point memory arrays, multiple-layer cross-point memories, so-called "n+1" memory structures, inter-pillar memory structures, and many other memory systems. The use of tunnel-junction devices as control elements can result in thinner, faster, and lower cost memory cells than those using other control elements.

Although the foregoing has been a description and illustration of specific embodiments of the invention, various modifications and changes thereto can be made by persons skilled in the art without departing from the scope and spirit of the invention as defined by the following claims. For example, control of tunnel-junction device resistance ratios may be achieved by methods other than controlling cross-sectional areas, and various current source circuits may be employed other than those illustrated by the embodiments disclosed herein.

What is claimed is:

1. A method of fusing a memory storage element including a first tunnel-junction device, said method comprising the steps of:
   connecting in series with said memory storage element a control element comprising a second tunnel-junction device, thereby forming a series combination, and
   applying a suitable current to said series combination, to fuse said first tunnel-junction device of said memory storage element,
   while protecting said second tunnel-junction device of said control element from fusing.

2. The method of claim 1, wherein said suitable current is a predetermined current sufficient for fusing said first tunnel-junction device of said memory storage element.

3. The method of claim 1, wherein said suitable current is applied for at least a predetermined time interval.

4. The method of claim 1, wherein said second tunnel-junction device has a characteristic fusing threshold voltage, and said protecting step is performed by preventing voltage across said second tunnel-junction device of said control element from exceeding said characteristic fusing threshold voltage.

5. The method of claim 4, wherein said fusing-threshold-voltage-preventing is performed by connecting a sense amplifier to said series combination, sensing at least one parameter of a suitable voltage and the current through said series combination, and controlling said current through said series combination to a suitable value in accordance with said parameter sensed.

6. The method of claim 5, wherein said suitable voltage sensed is a voltage determined by electrically coupling a reference tunnel-junction device to a current source.

7. The method of claim 4, wherein said control element has a control-element cross-sectional area, said memory storage element has a memory-storage-element cross-sectional area, and
   said control-element cross-sectional area is made about equal to said memory-storage-element cross-sectional area.

8. The method of claim 4, wherein said control element has a control-element cross-sectional area, said memory storage element has a memory-storage-element cross-sectional area, and
   said fusing-threshold-voltage-preventing is performed by making said control-element cross-sectional area larger than said memory-storage-element cross-sectional area.

9. The method of claim 8, wherein said control-element cross-sectional area is made at least twice said memory-storage-element cross-sectional area.

10. The method of claim 4, further comprising the step of providing a reference tunnel-junction device, wherein said fusing-threshold-voltage-preventing is performed by connecting a sense amplifier to said series combination, sensing at least one parameter of a suitable voltage and the current through said reference device, and controlling said current through said series combination to a suitable value in accordance with said parameter sensed.

11. The method of claim 10, wherein said reference device is connected in a current-mirror configuration with said series combination of said memory storage element and said control element.

12. A method of fusing a memory storage element including a first tunnel-junction device having a first characteristic fusing threshold voltage connected in series combination with a control element comprising a second tunnel-junction device having a second characteristic fusing threshold voltage, said series combination being connected in parallel with a reference element including a third tunnel-junction device having a third characteristic fusing threshold voltage less than or substantially equal to said second characteristic fusing threshold voltage, said method comprising the steps of:

applying a suitable current to said series combination, to fuse said first tunnel-junction device of said memory storage element while sensing at least one parameter of a suitable voltage and the current through said reference element; and controlling said suitable current applied through said series combination to a suitable value in accordance with said parameter sensed, thus protecting said second tunnel-junction device of said control element from fusing, said protecting step being performed by preventing voltage across said second tunnel-junction device of said control element from exceeding said second characteristic fusing threshold voltage.

13. A memory storage element made by the fusing method of claim 1.

14. A memory cell including a memory storage element made by the fusing method of claim 1.

15. A storage device including a multiplicity of memory storage elements made by the fusing method of claim 1.

16. An electronic device including a multiplicity of memory storage elements made by the fusing method of claim 1.

17. A method of programming a memory having a multiplicity of memory storage elements of which each memory storage element includes a first tunnel-junction device having a first characteristic fusing threshold voltage, said method comprising the steps of:

a) connecting in series with each of said memory storage elements a control element comprising a second tunnel-junction device having a second characteristic fusing threshold voltage, thereby forming a series combination; and b) selectively fusing said first tunnel-junction device of each selected memory storage element by applying a suitable current to said series combination; while c) preventing voltage across said second tunnel-junction device of said control element of each selected memory storage element from exceeding said second characteristic fusing threshold voltage, thus protecting said second tunnel-junction device of said control element of said selected memory storage element from fusing; and d) repeating steps (b) and (c) for each selected memory storage element.

18. A storage device including a memory made by the method of claim 17.

19. An electronic device including a memory made by the method of claim 17.

20. An integrated circuit including a memory made by the method of claim 17.

21. The method of claim 17, wherein said fusing-threshold-voltage-preventing is performed by connecting a sense amplifier to said series combination, sensing at least one parameter of a suitable voltage and the current through said series combination, and controlling said suitable current in accordance with said parameter sensed.

22. The method of claim 17, further comprising the steps of:

providing a reference element in parallel with said series combination, said reference element including a tunnel-junction device having a third characteristic fusing threshold voltage less than or substantially equal to said second characteristic fusing threshold voltage of said tunnel junction of said control element; and connecting a sense amplifier to said reference element, sensing at least one parameter of a suitable voltage and the current through said reference element, and controlling said suitable current in accordance with said parameter sensed.

23. A storage device including a memory made by the method of claim 22.

24. An electronic device including a memory made by the method of claim 22.

25. An integrated circuit including a memory made by the method of claim 22.

* * * * *